United States Patent
Okita et al.

(10) Patent No.: US 9,276,027 B2
(45) Date of Patent: Mar. 1, 2016

(54) SOLID-STATE IMAGE SENSOR AND CAMERA

(71) Applicant: CANON KABUSHIKI KAISHA, Tokyo (JP)

(72) Inventors: Akira Okita, Yamato (JP); Masahiro Kobayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/831,224

(22) Filed: Aug. 20, 2015

(65) Prior Publication Data

US 2015/0357358 A1    Dec. 10, 2015

Related U.S. Application Data

(63) Continuation of application No. 14/359,640, filed as application No. PCT/JP2013/050704 on Jan. 9, 2013, now Pat. No. 9,147,708.

(30) Foreign Application Priority Data

Jan. 18, 2012 (JP) ................... 2012-008448

(51) Int. Cl.
*H04N 5/335* (2011.01)
*H01L 27/146* (2006.01)

(52) U.S. Cl.
CPC ........ *H01L 27/1461* (2013.01); *H01L 27/1463* (2013.01); *H01L 27/14605* (2013.01);
(Continued)

(58) Field of Classification Search
CPC .......... H01L 27/14625; H01L 27/14641; H01L 27/14806; H01L 27/1461; H01L 27/1464; H01L 27/14643; H01L 31/103
USPC .......... 348/294, 299, 308; 257/290, 291, 292, 257/461, 436; 250/208.1
See application file for complete search history.

(56) References Cited

U.S. PATENT DOCUMENTS 5,097,307 A    3/1992    Bierhoff
6,084,259 A    7/2000    Kwon et al.
(Continued)

FOREIGN PATENT DOCUMENTS

EP    2207204 A2    7/2010
JP    H03-035559 A    2/1991
(Continued)

OTHER PUBLICATIONS

International Search Report and Written Opinion issued in International Application No. PCT/JP32013/050704 dated Apr. 23, 2013.
(Continued)

*Primary Examiner* — Sinh Tran
*Assistant Examiner* — Zhenzhen Wu
(74) *Attorney, Agent, or Firm* — Fitzpatrick, Cella, Harper & Scinto

(57) ABSTRACT

An image sensor including a first semiconductor region of a first conductivity type that is arranged in a substrate, a second semiconductor region of a second conductivity type that is arranged in the first semiconductor region to form a charge accumulation region. The second semiconductor region includes a plurality of portions arranged in a direction along a surface of the substrate. A potential barrier is formed between the plurality of portions. The second semiconductor region is wholly depleted by expansion of a depletion region from the first semiconductor region to the second semiconductor region. A finally-depleted portion to be finally depleted, of the second semiconductor region, is depleted by the expansion of the depletion region from a portion of the first semiconductor region, located in a lateral direction of the finally-depleted portion.

10 Claims, 12 Drawing Sheets

(52) U.S. Cl.
CPC .... *H01L27/14627* (2013.01); *H01L 27/14638* (2013.01); *H01L 27/14641* (2013.01); *H01L 27/14643* (2013.01)

(56) References Cited

U.S. PATENT DOCUMENTS

| | | | |
|---|---|---|---|
| 6,376,871 B1 | 4/2002 | Arai | |
| 7,187,052 B2 | 3/2007 | Okita et al. | |
| 7,256,379 B2 | 8/2007 | Sugiyama et al. | |
| 7,283,305 B2 | 10/2007 | Okita et al. | |
| 7,294,818 B2 | 11/2007 | Matsuda et al. | |
| 7,321,110 B2 | 1/2008 | Okita et al. | |
| 7,408,210 B2 | 8/2008 | Ogura et al. | |
| 7,456,880 B2 | 11/2008 | Okita et al. | |
| 7,460,162 B2 | 12/2008 | Koizumi et al. | |
| 7,462,810 B2 | 12/2008 | Kobayashi et al. | |
| 7,466,003 B2 | 12/2008 | Ueno et al. | |
| 7,514,732 B2 | 4/2009 | Okita et al. | |
| 7,531,885 B2 | 5/2009 | Okita et al. | |
| 7,538,804 B2 | 5/2009 | Okita et al. | |
| 7,538,810 B2 | 5/2009 | Koizumi et al. | |
| 7,550,793 B2 | 6/2009 | Itano et al. | |
| 7,557,847 B2 | 7/2009 | Okita et al. | |
| 7,646,493 B2 | 1/2010 | Okita et al. | |
| 7,652,713 B2 | 1/2010 | Yamasaki | |
| 7,688,377 B2 | 3/2010 | Matsuda et al. | |
| 7,872,286 B2 | 1/2011 | Okita et al. | |
| 7,928,477 B2 | 4/2011 | Kobayashi et al. | |
| 7,935,995 B2 | 5/2011 | Watanabe et al. | |
| 7,978,241 B2 | 7/2011 | Koizumi et al. | |
| 8,009,213 B2 | 8/2011 | Okita et al. | |
| 8,045,034 B2 | 10/2011 | Shibata et al. | |
| 8,063,351 B2 | 11/2011 | Kobayashi et al. | |
| 8,063,958 B2 | 11/2011 | Okita et al. | |
| 8,089,545 B2 | 1/2012 | Koizumi et al. | |
| 8,102,016 B2 | 1/2012 | Yamada | |
| 8,106,955 B2 | 1/2012 | Okita et al. | |
| 8,134,190 B2 | 3/2012 | Okita et al. | |
| 8,158,920 B2 | 4/2012 | Suzuki et al. | |
| 8,159,573 B2 | 4/2012 | Suzuki et al. | |
| 8,159,580 B2 | 4/2012 | Suzuki et al. | |
| 8,174,604 B2 | 5/2012 | Shibata et al. | |
| 8,199,235 B2 | 6/2012 | Okita et al. | |
| 8,222,682 B2 | 7/2012 | Watanabe et al. | |
| 8,259,206 B1 | 9/2012 | Shibata et al. | |
| 8,278,613 B2 | 10/2012 | Okita et al. | |
| 8,289,427 B2 | 10/2012 | Kawahito | |
| 8,289,432 B2 | 10/2012 | Shibata et al. | |
| 8,319,874 B2 | 11/2012 | Suzuki | |
| 8,357,956 B2 | 1/2013 | Kobayashi et al. | |
| 8,390,708 B2 | 3/2013 | Koizumi et al. | |
| 8,421,894 B2 | 4/2013 | Koizumi et al. | |
| 8,427,567 B2 | 4/2013 | Okita et al. | |
| 8,441,558 B2 | 5/2013 | Okita et al. | |
| 8,456,559 B2 | 6/2013 | Yamashita et al. | |
| 8,525,896 B2 | 9/2013 | Okita et al. | |
| 8,552,353 B2 | 10/2013 | Kobayashi et al. | |
| 8,553,101 B2 | 10/2013 | Okita et al. | |
| 8,614,759 B2 | 12/2013 | Watanabe et al. | |
| 8,643,765 B2 | 2/2014 | Takada et al. | |
| 8,698,935 B2 | 4/2014 | Okita et al. | |
| 8,723,232 B2 | 5/2014 | Kobayashi et al. | |
| 8,749,675 B2 | 6/2014 | Koizumi et al. | |
| 8,749,683 B2 | 6/2014 | Minowa et al. | |
| 9,025,060 B2 | 5/2015 | Nishio et al. | |
| 2002/0121652 A1 | 9/2002 | Yamasaki | |
| 2006/0138580 A1 | 6/2006 | Kim et al. | |
| 2009/0290059 A1 | 11/2009 | Suzuki | |
| 2010/0182465 A1 | 7/2010 | Okita | |
| 2010/0230583 A1 | 9/2010 | Nakata et al. | |
| 2011/0074993 A1 | 3/2011 | Okita et al. | |
| 2012/0068049 A1* | 3/2012 | Ogawa | H01L 27/14601 250/208.1 |
| 2013/0082343 A1 | 4/2013 | Fudaba et al. | |
| 2013/0083225 A1 | 4/2013 | Minowa et al. | |
| 2013/0113966 A1 | 5/2013 | Arishima et al. | |
| 2013/0128085 A1* | 5/2013 | Yamada | H04N 5/335 348/294 |
| 2013/0140665 A1 | 6/2013 | Koizumi et al. | |
| 2013/0181118 A1 | 7/2013 | Koizumi et al. | |
| 2013/0182163 A1 | 7/2013 | Kobayashi et al. | |
| 2013/0187210 A1 | 7/2013 | Kobayashi et al. | |
| 2013/0194468 A1 | 8/2013 | Okita | |
| 2013/0222631 A1 | 8/2013 | Iwane et al. | |
| 2014/0002684 A1 | 1/2014 | Okita et al. | |
| 2014/0036121 A1 | 2/2014 | Minowa et al. | |
| 2014/0061436 A1 | 3/2014 | Kobayashi | |
| 2014/0225173 A1* | 8/2014 | Kim | H01L 27/14612 257/292 |
| 2014/0333815 A1 | 11/2014 | Iwane et al. | |
| 2014/0340555 A1 | 11/2014 | Iwane et al. | |

FOREIGN PATENT DOCUMENTS

| | | |
|---|---|---|
| JP | 2000-082839 A | 3/2000 |
| JP | 2002-165126 A | 6/2002 |
| JP | 2004-264034 A | 9/2004 |
| JP | 2008-103647 A | 5/2008 |
| JP | 2008-193527 A | 8/2008 |
| JP | 2010-114275 A | 5/2010 |
| WO | 2008/069141 A1 | 6/2008 |

OTHER PUBLICATIONS

Extended European Search Report dated Aug. 3, 2015 in a foreign counterpart application European Patent Application No. 13738370.9.

* cited by examiner

F I G. 7
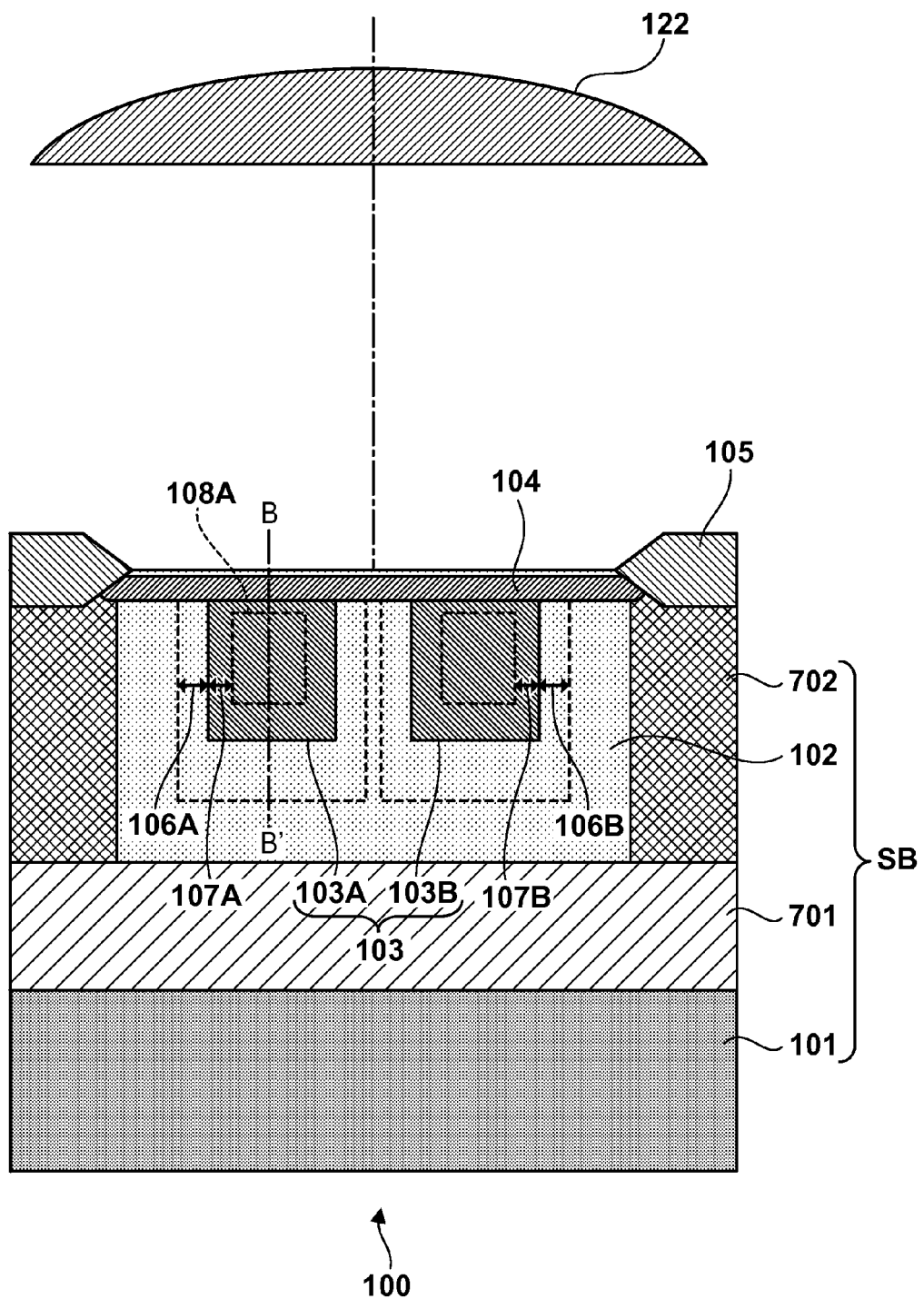

F I G. 9A
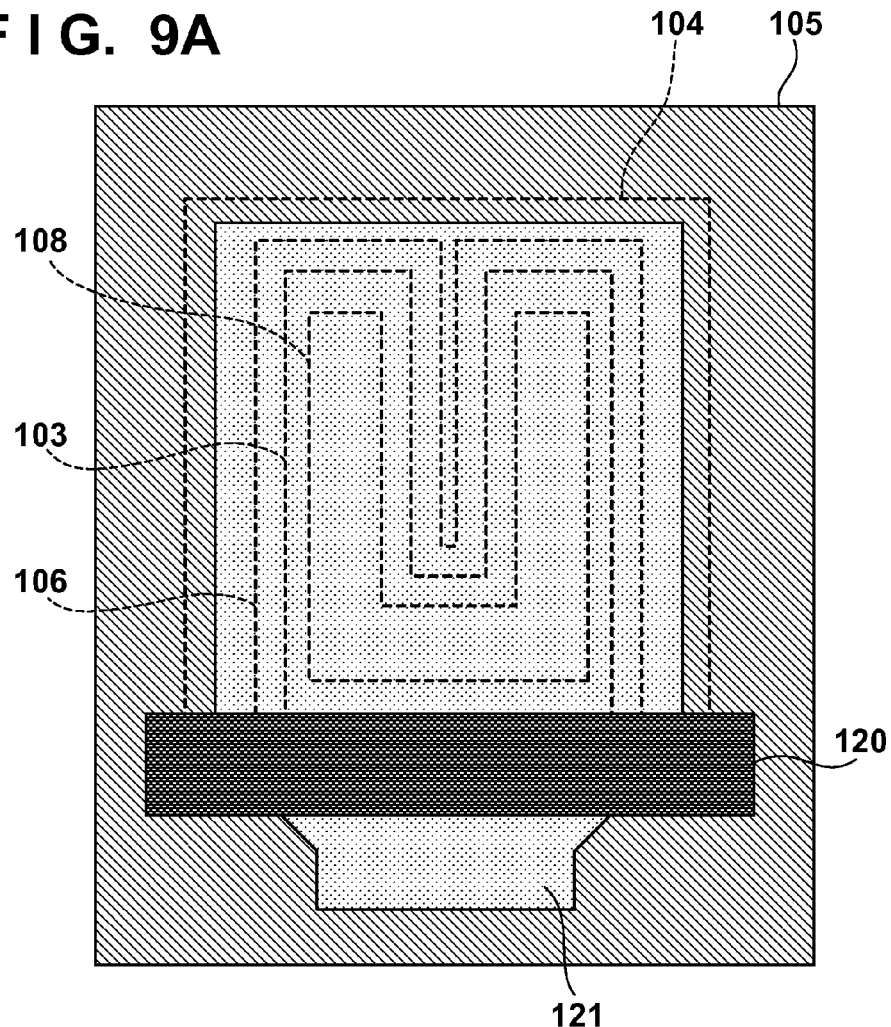
F I G. 9B
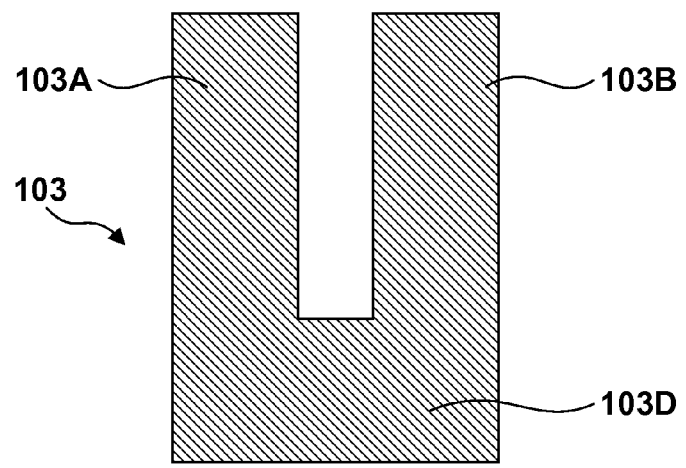

SOLID-STATE IMAGE SENSOR AND CAMERA

This application is a continuation of pending application Ser. No. 14/359,640, filed May 21, 2014, which has been allowed, which was the National Stage of International Patent Application No. PCT/JP2013/050704 filed Jan. 9, 2013.

TECHNICAL FIELD

The present invention relates to a solid-state image sensor and a camera including the same.

BACKGROUND ART

In a solid-state image sensor, the pixel size becomes small along with an increase in the number of pixels, and a resultant decrease in the saturated number of charges poses a problem. Japanese Patent Laid-Open No. 2010-114275 describes a solid-state image sensor that increases the saturated quantity of charges. The solid-state image sensor described in Japanese Patent Laid-Open No. 2010-114275 includes a plurality of photodiodes stacked in a semiconductor substrate, and a vertical transistor arranged in the semiconductor substrate to read out charges from the plurality of photodiodes.

The solid-state image sensor described in Japanese Patent Laid-Open No. 2010-114275 has a complex structure including the plurality of photodiodes and the vertical transistor formed in the semiconductor substrate. For this reason, a lot of steps are necessary for manufacturing, and process control for manufacturing is difficult.

SUMMARY OF INVENTION

The present invention provides a solid-state image sensor that is easy to manufacture and has an arrangement advantageous for increasing the saturated number of charges, and a camera including the same.

The first aspect of the present invention provides a solid-state image sensor comprising: a semiconductor substrate; a first semiconductor region of a first conductivity type arranged in the semiconductor substrate; a second semiconductor region of a second conductivity type constituting a charge accumulation region, and being arranged in the first semiconductor region; and a lens for condensing light to the second semiconductor region, wherein the second semiconductor region includes a plurality of portions arranged in a direction along a surface of the semiconductor substrate, a potential barrier to a charge accumulated in the charge accumulation region is formed between the plurality of portions, the second semiconductor region is configured to be wholly depleted by expansion of a depletion region from the first semiconductor region toward the second semiconductor region, and a finally-depleted portion, which is a part of the second semiconductor region and to be finally depleted of the second semiconductor region, is configured to be depleted by the expansion of the depletion region from a portion of the first semiconductor region, located in a lateral direction of the finally-depleted portion, toward the finally-depleted portion.

The second aspect of the present invention provides a solid-state image sensor comprising: a semiconductor substrate; a first semiconductor region of a first conductivity type arranged in the semiconductor substrate; a second semiconductor region of a second conductivity type constituting a charge accumulation region, and being arranged in the first semiconductor region; and a lens for condensing light to the second semiconductor region, wherein the second semiconductor region includes a plurality of portions arranged in a direction along a surface of the semiconductor substrate, a potential barrier to a charge accumulated in the charge accumulation region is formed between the plurality of portions, and in each of the plurality of portions, an integration N1 of an impurity concentration along a depth direction of the semiconductor substrate, and an integration N2 of the impurity concentration along a direction in which the plurality of portions are arranged, satisfy a relationship given by N1>N2.

The third aspect of the present invention provides a solid-state image sensor comprising: a semiconductor substrate; a first semiconductor region of a first conductivity type arranged in the semiconductor substrate; a second semiconductor region of a second conductivity type constituting a charge accumulation region and being arranged in the first semiconductor region; and a lens for condensing light to the second semiconductor region, wherein the second semiconductor region includes a plurality of portions arranged in a direction along a surface of the semiconductor substrate, a part of the first semiconductor region is arranged between the plurality of portions, by applying a reverse bias voltage, having a predetermined magnitude, between the first semiconductor region and the second semiconductor region, a depletion region expands from the first semiconductor region toward the second semiconductor region, thereby wholly depleting the second semiconductor region, a finally-depleted portion, which is a part of the second semiconductor region and to be finally depleted of the second semiconductor region, is configured to be depleted by the expansion of the depletion region from a portion of the first semiconductor region, located in a lateral direction of the finally-depleted portion, toward the finally-depleted portion, and by applying the reverse bias voltage between the first semiconductor region and the second semiconductor region, the depletion region expands from the second semiconductor region to the part of the first semiconductor region, thereby wholly depleting the part of the first semiconductor region.

The fourth aspect of the present invention provides a solid-state image sensor comprising: a semiconductor substrate; a first semiconductor region of a first conductivity type arranged in the semiconductor substrate; a second semiconductor region of a second conductivity type constituting a charge accumulation region, and being arranged in the first semiconductor region; and a lens for condensing light to the second semiconductor region, wherein the second semiconductor region includes a plurality of portions arranged in a direction along a surface of the semiconductor substrate, a potential barrier to a charge accumulated in the charge accumulation region is formed between the plurality of portions, the second semiconductor region is configured to be wholly depleted by expansion of a depletion region from the first semiconductor region toward the second semiconductor region, a finally-depleted portion, which is a part of the second semiconductor region and to be finally depleted of the second semiconductor region, is configured to be depleted by the expansion of the depletion region from a portion of the first semiconductor region, located in a lateral direction of the finally-depleted portion, toward the finally-depleted portion, and an interval between the plurality of portions is within a range from 0.1 µm to 1.0 µm.

The fifth aspect of the present invention provides a camera comprising: a solid-state image sensor according to any one of the first to fourth aspect of the present invention; and a processing unit that processes a signal output from the solid-state image sensor.

Further features of the present invention will become apparent from the following description of exemplary embodiments with reference to the attached drawings.

BRIEF DESCRIPTION OF DRAWINGS

FIG. 7 is a sectional view schematically showing the structure of one pixel of a solid-state image sensor according to the second embodiment of the present invention;

FIGS. 9A and 9B are plan views schematically showing the structure of one pixel of a solid-state image sensor according to the fourth embodiment of the present invention;

DESCRIPTION OF EMBODIMENTS

The embodiments of the present invention will now be described with reference to the accompanying drawings. To offer a more detailed example, a case will be described below in which the first conductivity type is a p type, and the second conductivity type is an n type. However, the first conductivity type may be changed to an n type, and the second conductivity type may be changed to a p type.

One or more embodiments of the present invention provide a solid-state image sensor that is easy to manufacture and has an arrangement advantageous for increasing the saturated number of charges, and a camera including the same.

First Embodiment

Figure 1:
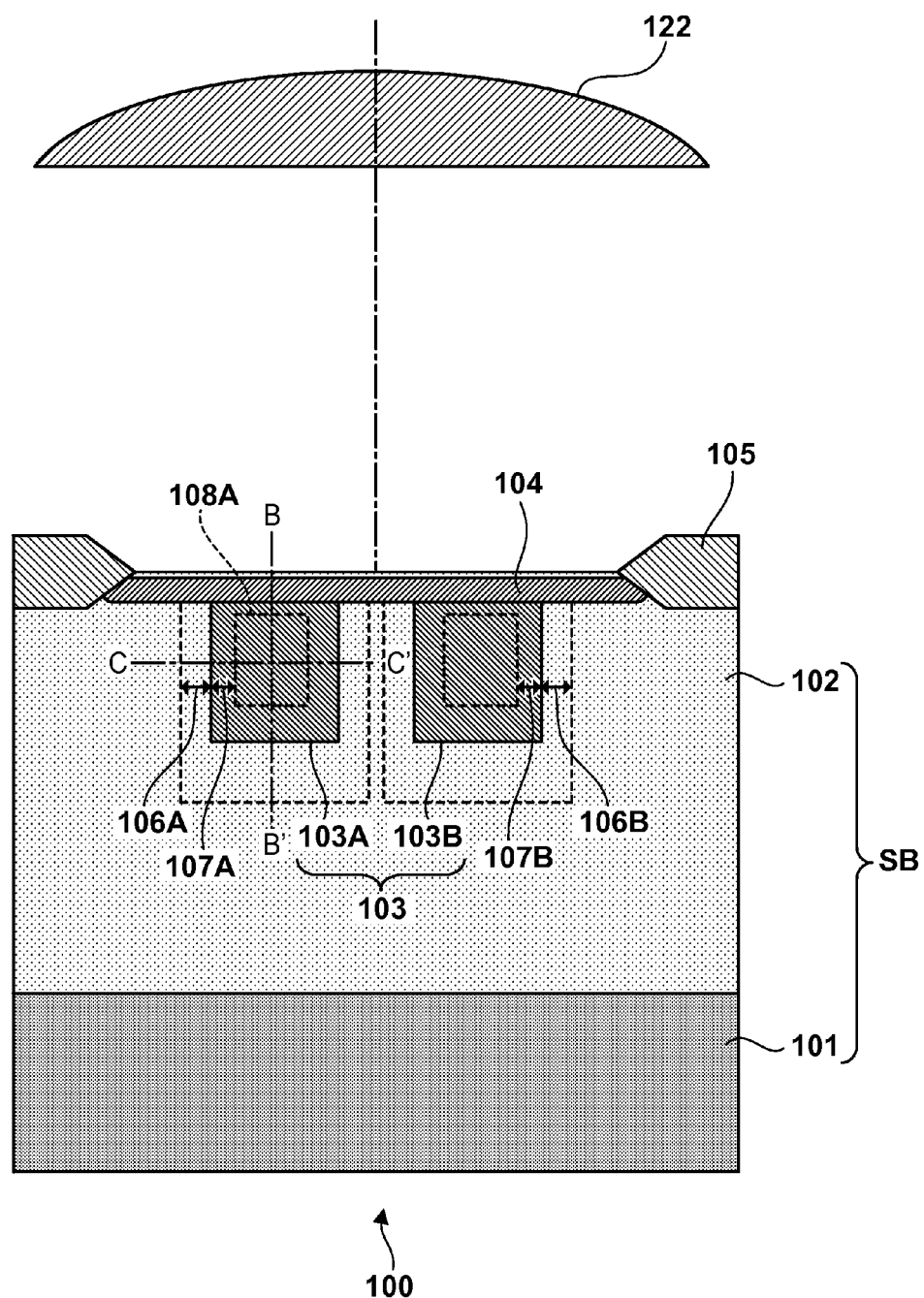
FIG. 1 is a sectional view schematically showing the structure of one pixel of a solid-state image sensor according to the first embodiment of the present invention.
Figure 2:
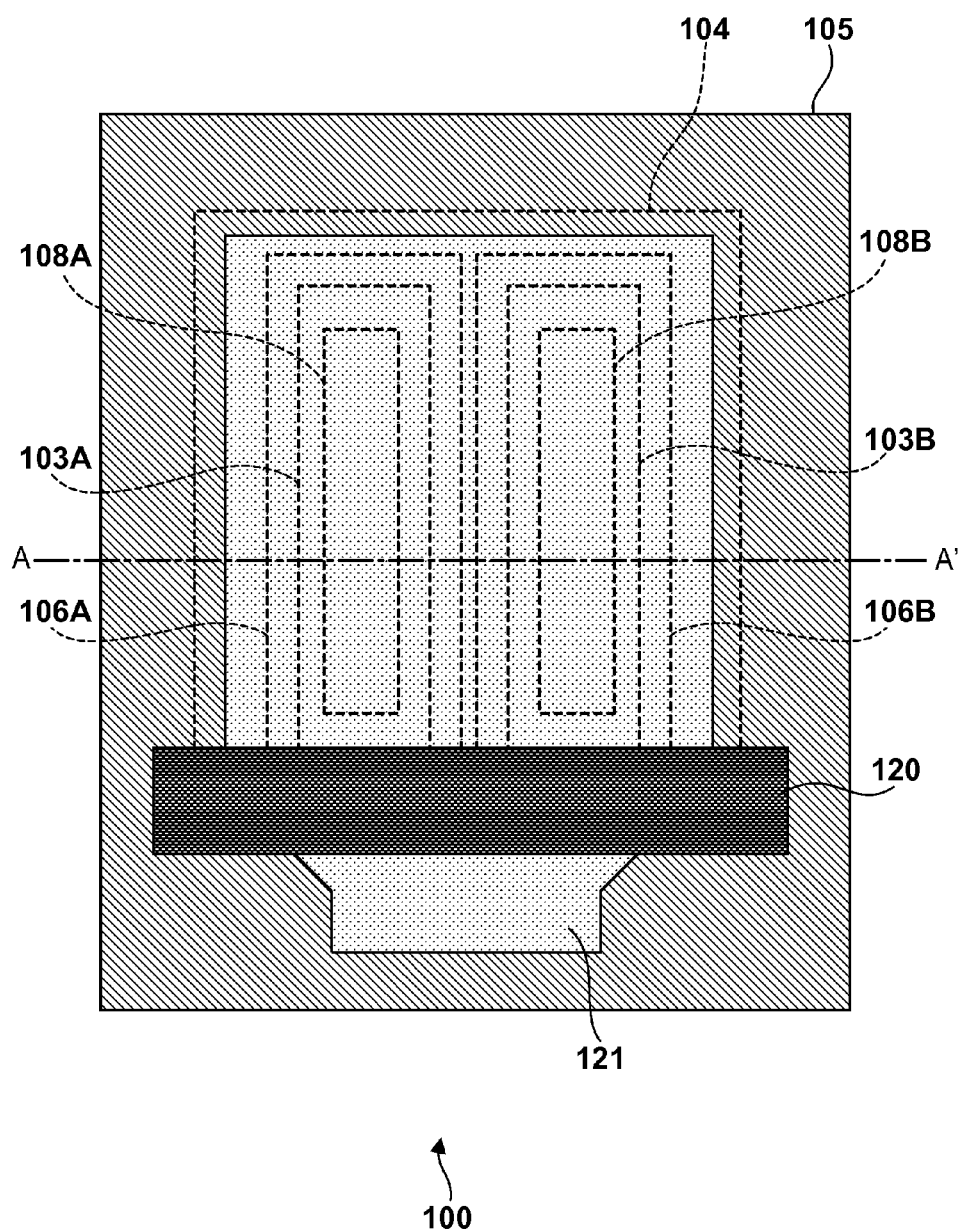
FIG. 2 is a plan view schematically showing the structure of one pixel of the solid-state image sensor according to the first embodiment of the present invention.

FIGS. 1 and 2 are sectional and plan views, respectively, schematically showing the structure of one pixel of a solid-state image sensor 100 according to the first embodiment of the present invention. FIG. 1 is a sectional view taken along a line A-A' in FIG. 2. The solid-state image sensor 100 includes a semiconductor substrate SB. The semiconductor substrate SB can include, for example, a semiconductor region 101 of the second conductivity type (n type), and a semiconductor region (well region) 102 of the first conductivity type (p type) arranged on the semiconductor region 101. A second semiconductor region 103 of the second conductivity type (n type) that constitutes a charge accumulation region is arranged in the first semiconductor region 102 of the first conductivity type (p type). A semiconductor region 104 of the first conductivity type (p type) can be arranged on the upper surface side of the second semiconductor region 103. A lens 122 that condenses light to the second semiconductor region 103 can be arranged on the semiconductor substrate SB. The second semiconductor region 103 includes a plurality of portions 103A and 103B arranged in a direction along the surface of the semiconductor substrate SB. A photodiode serving as a photoelectric conversion element can be constituted by the first semiconductor region 102 of the first conductivity type (p type) and the second semiconductor region 103 of the second conductivity type (n type). The photodiode may further include the semiconductor region 104 of the first conductivity type (p type) arranged on the second semiconductor region 103. Each pixel can be isolated from other pixels by an element isolation 105 such as LOCOS (LOCal Oxidation of Silicon) isolation or STI (Shallow Trench Isolation). A potential barrier is formed between the plurality of portions 103A and 103B. In the first embodiment, the plurality of portions 103A and 103B can electrically be isolated from each other by the potential barrier. The potential barrier is a region where the potential to signal charges accumulated in the charge accumulation region is higher than in the charge accumulation region. For example, if the signal charges are electrons, the potential barrier is a region where the potential to the electrons is higher than in the second semiconductor region 103. The potential barrier can be constituted by a semiconductor region of the first conductivity type. The potential barrier may include an insulator-isolating portion such as STI, LOCOS isolation, or mesa-type isolation. Note that when the signal charges are holes, the potential barrier is a region where the potential to the holes is higher than in the charge accumulation region.

Depletion regions 106A and 106B are formed in portions adjacent to the second semiconductor region 103 (portions 103A and 103B) of the second conductivity type (n type) out of the first semiconductor region 102 of the first conductivity type (p type). Depletion regions 107A and 107B are formed in the second semiconductor region 103 (portions 103A and 103B) of the second conductivity type (n type). The higher the reset voltage (reverse bias voltage) applied between the first semiconductor region 102 and the second semiconductor region 103 (portions 103A and 103B) is, the larger the depletion regions 106A, 106B, 107A, and 107B are. The magnitude of the reset voltage is set such that the second semiconductor region 103 (portions 103A and 103B) is wholly depleted, that is, undepleted neutral regions 108A and 108B are eliminated.

When the reset voltage is applied between the first semiconductor region 102 and the second semiconductor region 103 (portions 103A and 103B), the depletion regions expand from the first semiconductor region 102 to the second semiconductor region 103, and the whole second semiconductor region 103 is depleted. Entirely depleting the second semiconductor region 103 contributes to improve the saturated quantity of charges.

The expansion of the depletion regions from the first semiconductor region 102 to the second semiconductor region 103 can be considered separately as expansion in the horizontal direction (direction parallel to the surface of the semiconductor substrate SB) and expansion in the vertical direction (direction perpendicular to the surface of the semiconductor substrate SB). A portion to be finally depleted out of the second semiconductor region 103 will be defined as a finally-depleted portion. The finally-depleted portion is depleted by the expansion of the depletion regions from portions located in the lateral direction (horizontal direction) of the finally-depleted portion out of the first semiconductor region 102 toward the finally-depleted portion (that is, expansion in the horizontal direction). The arrangement that depletes the finally-depleted portion by the expansion of the depletion regions in the horizontal direction from the portions located in the lateral direction of the finally-depleted portion out of the first semiconductor region 102 is obtained by dividing the second semiconductor region 103 into the plurality of portions 103A and 103B. To divide the second semiconductor region 103 into the plurality of portions 103A and 103B, the portions 103A and 103B are defined by an ion implantation mask used to form the second semiconductor region 103, and this can be implemented by a very simple process.

The solid-state image sensor 100 further includes a third semiconductor region 121 of the second conductivity type (n type) formed in the first semiconductor region 102 of the semiconductor substrate SB. The third semiconductor region 121 constitutes a floating diffusion (charge-voltage converter). The solid-state image sensor 100 also includes, on the semiconductor substrate SB, a transfer gate 120 that forms, in the first semiconductor region 102, a channel to transfer charges from the second semiconductor region 103 (portions 103A and 103B) to the third semiconductor region 121.

Figure 3:
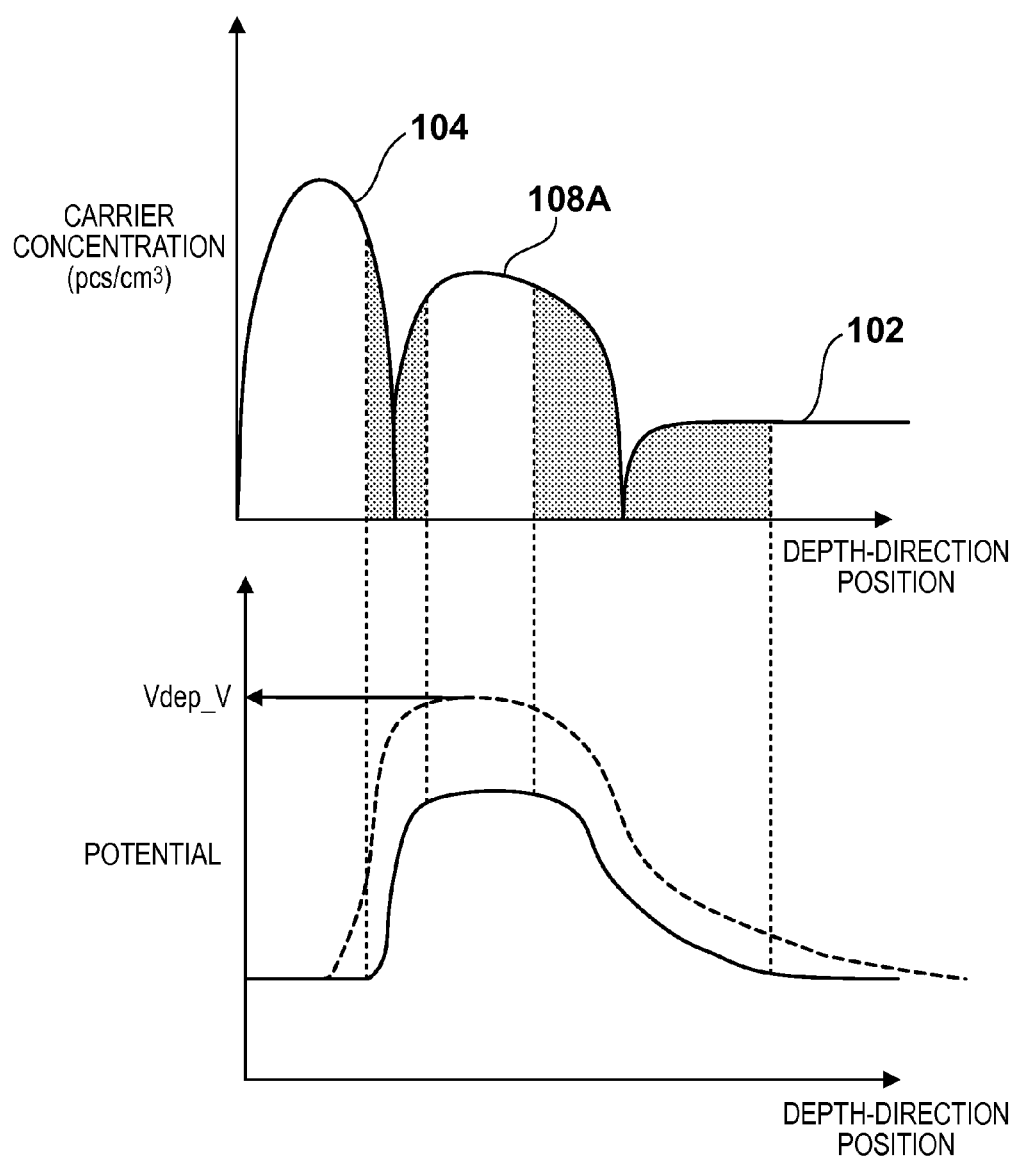
FIG. 3 shows graphs illustrating the carrier concentration profile and the potential profile on a section taken along a line B-B' in FIG. 1.
Figure 4:
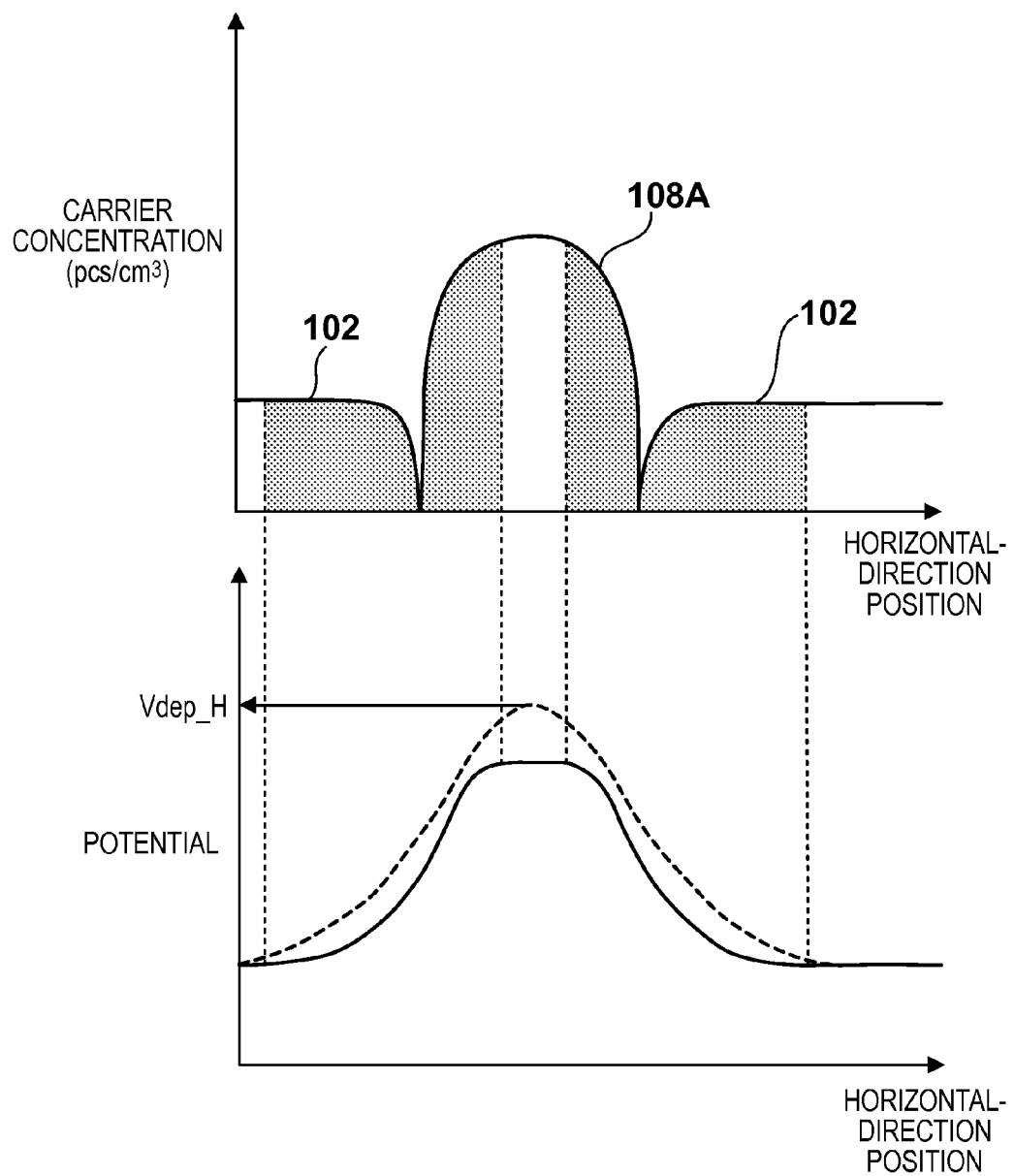
FIG. 4 shows graphs illustrating the carrier concentration profile and the potential profile on a section taken along a line C-C' in FIG. 1.

FIG. 3 illustrates the carrier concentration profile (impurity concentration profile) and the potential profile on a section taken along a line B-B' in FIG. 1. FIG. 4 illustrates the carrier concentration profile (impurity concentration profile) and the potential profile on a section taken along a line C-C' in FIG. 1. In this specification, the ordinate of a graph showing a potential profile represents a positive potential. That is, the larger the value along the ordinate is, the lower the potential for electrons is, or the higher the potential for holes is. The line C-C' passes through the portion having the maximum carrier concentration in the second semiconductor region 103 (portion 103A) in a direction parallel to the surface of the semiconductor substrate SB. Referring to FIGS. 3 and 4, a hatched portion represents a depleted region. In FIG. 3, the potential (potential indicated by the dotted line) to wholly deplete the neutral region 108A of the second semiconductor region 103A by expanding the depletion regions in the vertical direction (direction perpendicular to the surface of the semiconductor substrate SB) is a depletion voltage Vdep_V.

FIG. 4 illustrates the carrier concentration profile (impurity concentration profile) and the potential profile along the line C-C' that passes through the portion having the maximum carrier concentration in the second semiconductor region 103 (portion 103A) in a direction parallel to the surface of the semiconductor substrate SB. In FIG. 4, the potential (potential indicated by the dotted line) to wholly deplete the neutral region 108A of the second semiconductor region 103A by expanding the depletion regions in the horizontal direction (direction parallel to the surface of the semiconductor substrate SB) is a depletion voltage Vdep_H. Note that $$Vdep\_V > Vdep\_H$$

When the second semiconductor region 103 of the second conductivity type arranged in the first semiconductor region 102 of the first conductivity type is divided into the plurality of portions 103A and 103B, the total carrier amount of the second conductivity type between the first semiconductor region 102 and the second semiconductor region 103 can be decreased. Division of the second semiconductor region 103 is done to satisfy Vdep_V>Vdep_H. When the depletion regions expand from a side surface of the portion 103A and a side surface on the opposite side and come into contact with each other, depletion of the entire second semiconductor region 103A ends. When the depletion regions expand from a side surface of the portion 103B and a side surface on the opposite side and come into contact with each other, depletion of the entire second semiconductor region 103B ends.

Let N1 (pcs/cm²) be a value obtained by integrating the carrier concentration in the second semiconductor region 103 in FIGS. 3, and N2 (pcs/cm²) be a value obtained by integrating the carrier concentration in the second semiconductor region 103 in FIG. 4. In this case, a relationship given by N1>N2 is preferably satisfied. N1>N2 is the condition to deplete the finally-depleted portion by the expansion of the depletion regions from portions located in the lateral direction (horizontal direction) of the finally-depleted portion out of the first semiconductor region 102 toward the finally-depleted portion (that is, expansion in the horizontal direction).

Note that the expansion of the depletion regions in the vertical direction progresses at the same time as the expansion of the depletion regions in the horizontal direction. Hence, Vdep_V can be made low by dividing the second semiconductor region 103 of the second conductivity type arranged in the first semiconductor region 102 of the first conductivity type into the plurality of portions 103A and 103B. That is, even if Vdep_V>Vdep_H is not satisfied, the depletion voltage can be made low by dividing the second semiconductor region 103 into the plurality of portions 103A and 103B.

Figure 5:
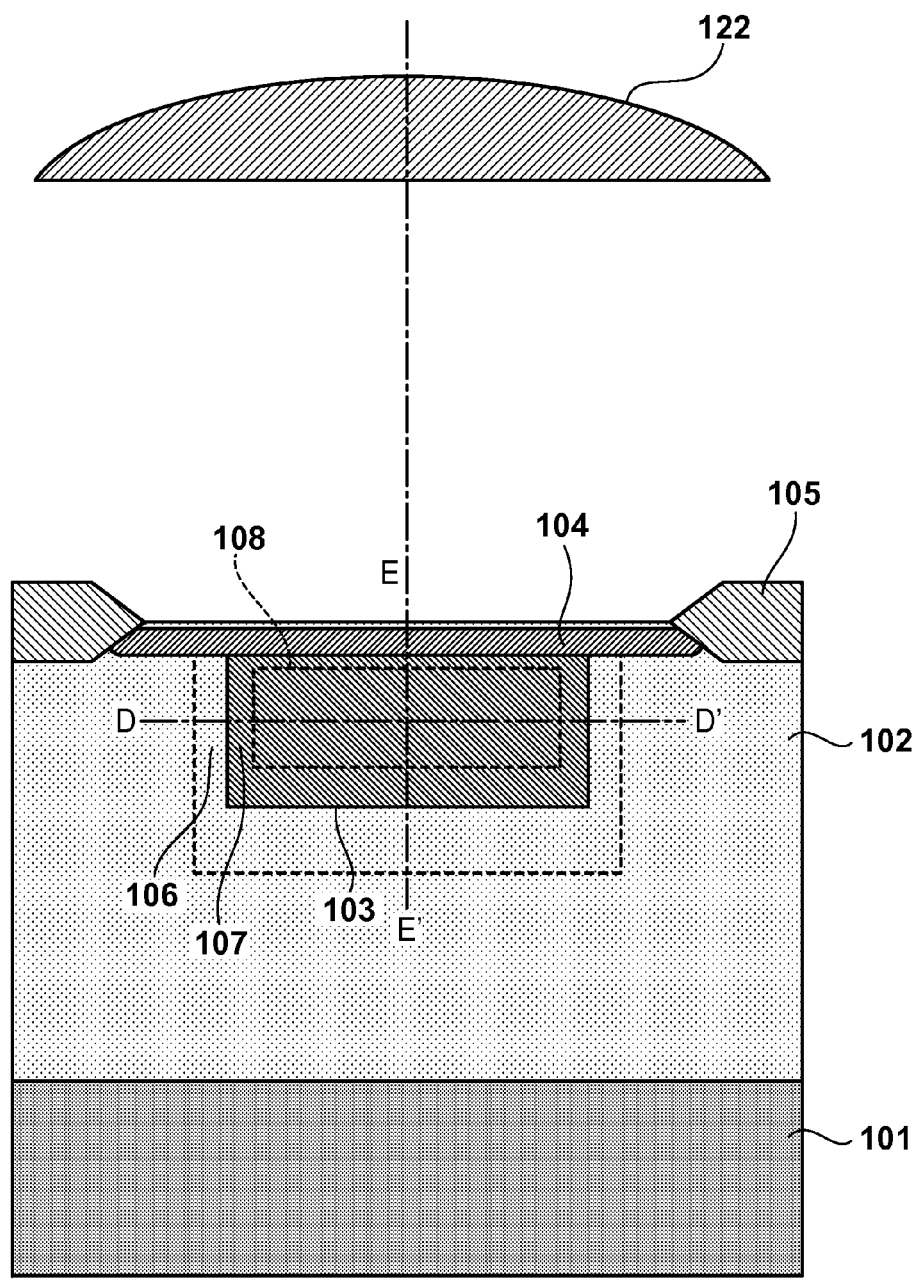
FIG. 5 is a sectional view showing a comparative example.
Figure 6:
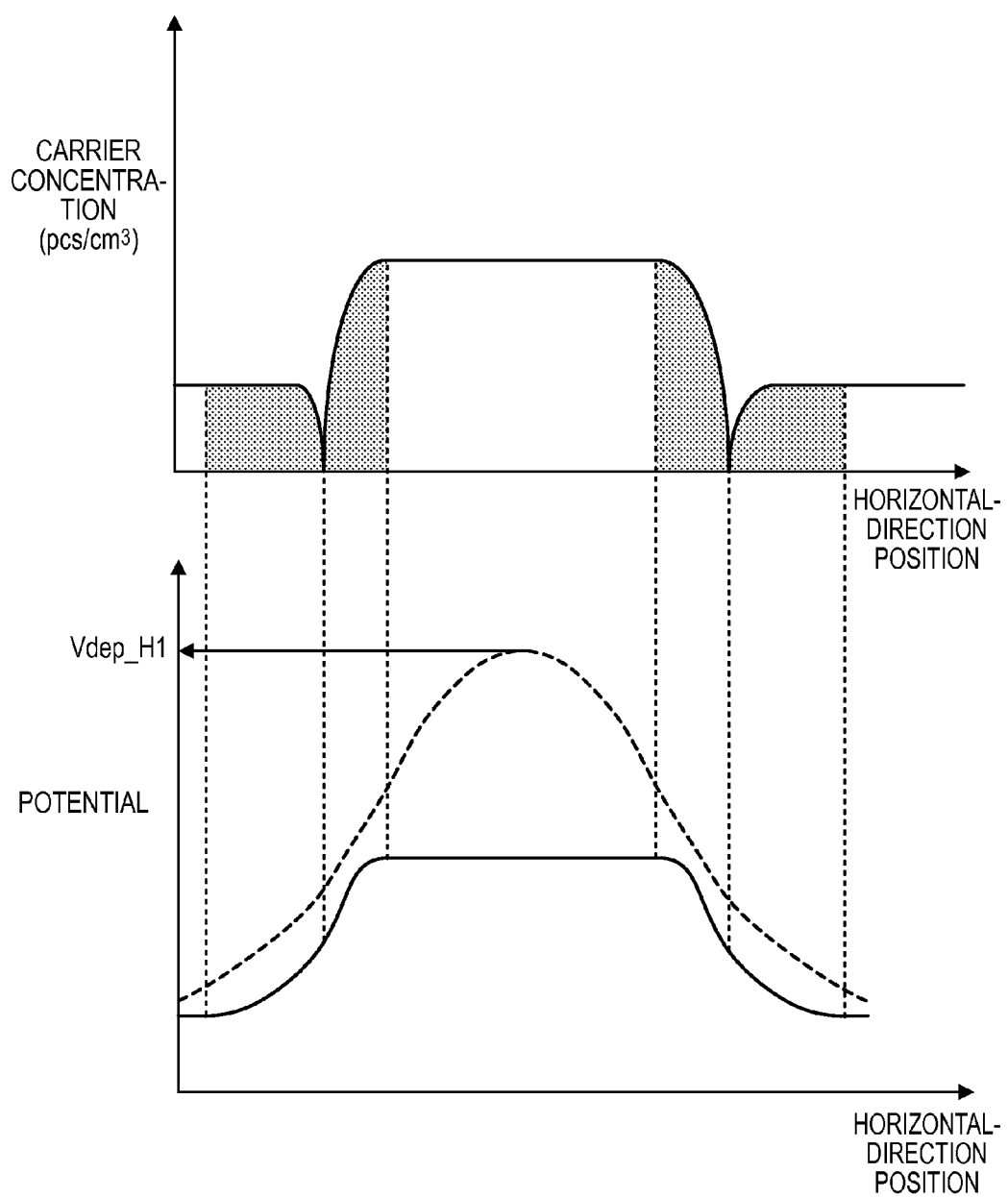
FIG. 6 shows graphs illustrating the carrier concentration profile and the potential profile on a section taken along a line D-D' in FIG. 5.

As a comparative example, consider a depletion voltage when the second semiconductor region 103 is not divided into the portions 103A and 103B, that is, no potential barrier is arranged, as shown in FIG. 5. The carrier concentration profile (impurity concentration profile) and the potential profile in a section taken along a line E-E' in FIG. 5 are the same as those shown in FIG. 3. However, note that as illustrated in FIG. 6, the carrier concentration profile (impurity concentration profile) and the potential profile in a section taken along a line D-D' in FIG. 5 are different from those shown in FIG. 4. If the second semiconductor region 103 is not divided into the portions 103A and 103B, as shown in FIG. 5, the potential to wholly deplete the neutral region 108A of the second semiconductor region 103A by expanding the depletion regions in the horizontal direction is a depletion voltage Vdep_H1.

In the example shown in FIG. 5, the finally-depleted portion that is a portion to be finally depleted out of the second semiconductor region 103 is depleted by the expansion of the depletion regions from portions located on the lower side (vertical direction) of the finally-depleted portion out of the first semiconductor region 102 toward the finally-depleted portion. In the example shown in FIG. 5, $$Vdep\_V < Vdep\_H1$$

In the comparative example shown in FIG. 5, when the depletion regions expand from the upper and lower ends of the second semiconductor region 103, and the depletion region expanding from the upper end and the depletion region expanding from the lower end come into contact with each other, depletion of the entire second semiconductor region 103 ends.

As described above, when the second semiconductor region 103 of the second conductivity type arranged in the first semiconductor region 102 of the first conductivity type includes the plurality of portions 103A and 103B, the depletion voltage can be made low. Since the reset voltage of the second semiconductor region 103 should be higher than the depletion voltage, the lower depletion voltage is advantageous in lowering the power supply voltage. If the power supply voltage is not lowered, the concentration in the second semiconductor region 103 can be raised, and the saturated number of charges can be increased. This allows acquisition of a solid-state image sensor having a wide dynamic range.

The portions 103A and 103B that constitute the second semiconductor region 103 preferably have the same width in the direction along the line A-A' (direction intersecting the portions 103A and 103B). If the portions 103A and 103B have different widths, the narrower one of them is depleted first, and the wider one is depleted next. For this reason, the reset voltage and the like are defined by the depletion voltage of the wider portion.

The depletion regions 106A and 106B formed by depletion of the portions 103A and 103B that constitute the second semiconductor region 103 are preferably in contact with each other when the entire portions 103A and 103B are depleted (completely depleted). This allows acquisition of the same sensitivity as in the case in which the second semiconductor region 103 serving as the accumulation region is not divided. As the interval between the portions 103A and 103B becomes smaller, the depletion regions 106A and 106B formed by their depletion can easily be brought into contact with each other. However, if the interval is too small, the effect of expanding the depletion regions 107A and 107B from the first semiconductor region 102 between the portions 103A and 103B to the portions 103A and 103B weakens. Considering this, the interval between the portions 103A and 103B preferably falls within the range of 0.1 μm to 1.0 μm, and more preferably falls within the range of 0.2 μm to 0.5 μm. The boundary of the second semiconductor region 103 is, for example, the p-n junction interface to the adjacent first semiconductor region 102. Widening the interval between the plurality of portions 103A and 103B independently of the pixel size makes it possible to lower the depletion voltage while maintaining the sensitivity.

A pixel size advantageous in depleting the finally-depleted portion by the expansion of the depletion regions in the horizontal direction falls within the range of, for example, 2.0 μm to 7.0 μm. More preferably, the pixel size falls within the range of 4.0 μm to 6.0 μm. This is because a pixel size smaller than 2.0 μm makes the process for dividing the second semiconductor region 103 difficult, and a pixel size larger than 7.0 μm facilitates ensuring the saturated quantity of charges.

Second Embodiment

The second embodiment of the present invention will be described below with reference to FIG. 7. FIG. 7 is a sectional view taken along a line A-A' in FIG. 2 and schematically showing the structure of one pixel of a solid-state image sensor 100 according to the second embodiment of the present invention. Note that matters not mentioned in the second embodiment can comply with the first embodiment.

In the solid-state image sensor 100 according to the second embodiment, a semiconductor region 701 of the first conductivity type where the concentration is higher than that in a first semiconductor region 102 of the first conductivity type is arranged between a semiconductor region 101 of the second conductivity type (n type) and the first semiconductor region 102 of the first conductivity type (p type). Additionally, in the solid-state image sensor 100 according to the second embodiment, a semiconductor region 702 of the first conductivity type where the concentration is higher than that in the first semiconductor region 102 of the first conductivity type is arranged to surround the first semiconductor region 102 of the first conductivity type (p type).

The semiconductor region 701 can contribute to prompt depletion of a second semiconductor region 103 in the vertical direction. The semiconductor region 702 can function as an isolating region that isolates the pixels and also contribute to prompt depletion of the second semiconductor region 103 in the vertical direction. The distance between the semiconductor region 702 and portions 103A and 103B that constitute the second semiconductor region 103 can be configured to bring depletion regions 106A and 106B into contact with the semiconductor region 702. The distance between the semiconductor region 702 and the portions 103A and 103B is preferably, for example, 1 μm or less, and more preferably falls within the range of 0 to 0.4 μm. However, if the concentration in the second semiconductor region 103 (portions 103A and 103B) is higher than $1\times10^{17}$ cm$^{-3}$, the expansion of the depletion regions 106A and 106B may be too small, and a white spot may occur. To prevent this, the distance is most preferably about 0.2 μm. The concentration in the semiconductor regions 701 and 702 preferably falls within the range of $1\times10^{17}$ cm$^{-3}$ to $1\times10^{19}$ cm$^{-3}$, and more preferably falls within the range of $5\times10^{17}$ cm$^{-3}$ to $5\times10^{18}$ cm$^{-3}$. The impurity concentration in the semiconductor region 701 may be lower than that in the semiconductor region 702. The impurity concentration in the semiconductor region 702 may be higher than that in the first semiconductor region 102 of the first conductivity type arranged between the portions 103A and 103B.

Third Embodiment

Figure 8:
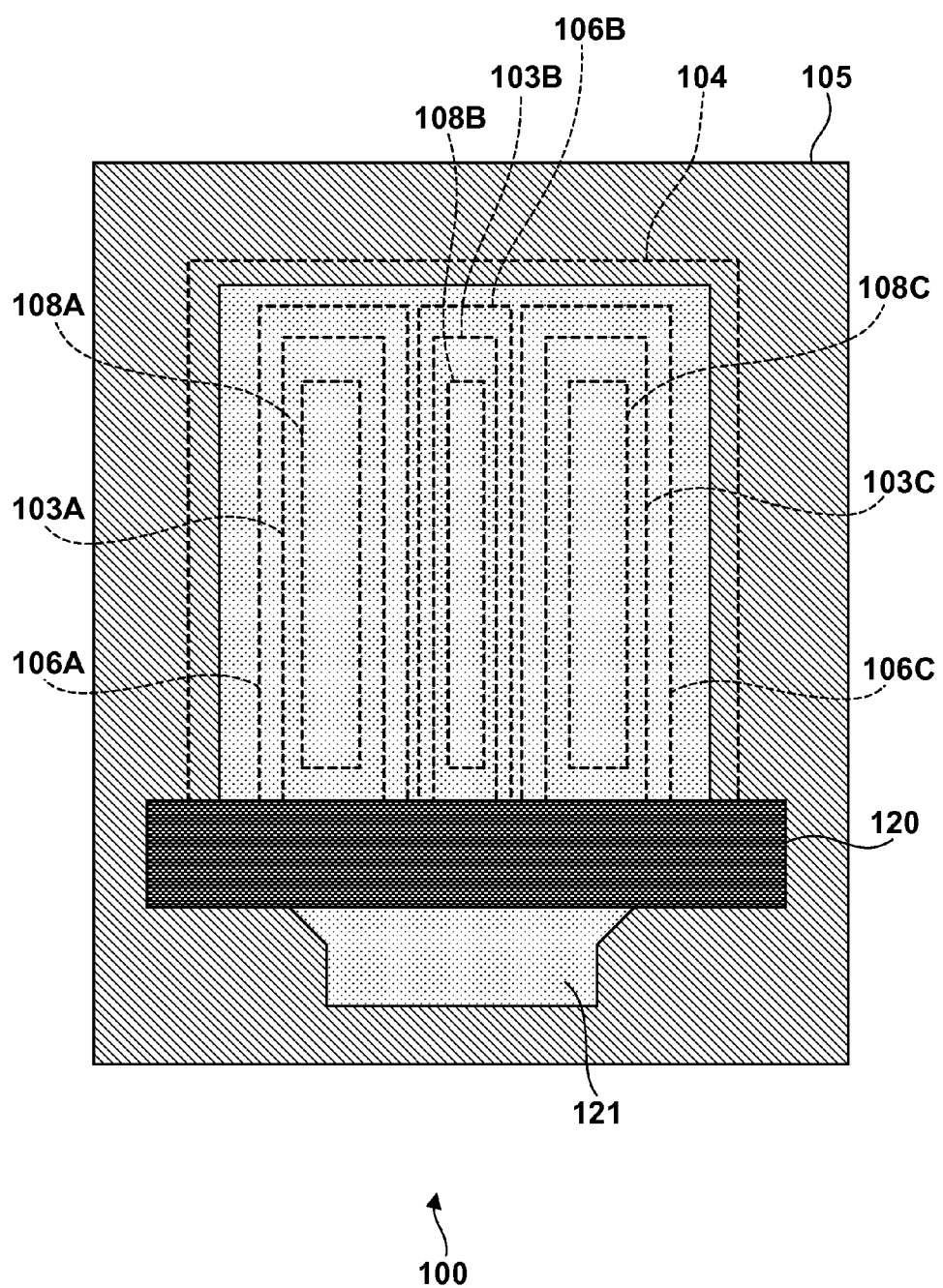
FIG. 8 is a plan view schematically showing the structure of one pixel of a solid-state image sensor according to the third embodiment of the present invention.

The third embodiment of the present invention will be described below with reference to FIG. 8. FIG. 8 is a plan view schematically showing the structure of one pixel of a solid-state image sensor 100 according to the third embodiment of the present invention. Note that matters not mentioned in the third embodiment can comply with the first and second embodiments.

In the third embodiment, a second semiconductor region 103 of the second conductivity type is divided into three portions 103A, 103B, and 103C. The second semiconductor region 103 is divided such that the second portion 103B is arranged between the first portion 103A and the third portion 103C. The width of each of the first portion 103A and the third portion 103C in a direction intersecting the first portion 103A, the second portion 103B, and the third portion 103C is preferably larger than the width of the second portion 103B. This is because the first portion 103A and the third portion 103C are depleted in the horizontal direction more easily than the second portion 103B.

Depletion regions 106A, 106B, and 106C are formed in portions adjacent to the second semiconductor region 103 (portions 103A, 103B, and 103C) of the second conductivity type (n type) out of a first semiconductor region 102 of the first conductivity type (p type). Depletion regions 107A, 107B, and 107C are formed in the second semiconductor region 103 (portions 103A, 103B, and 103C) of the second conductivity type (n type).

Note that the division count of the semiconductor region 103 that constitutes a charge accumulation region is not limited to 2 or 3 and may be 4 or more.

Fourth Embodiment

The fourth embodiment of the present invention will be described below with reference to FIGS. 9A and 9B. FIG. 9A is a plan view schematically showing the structure of one pixel of a solid-state image sensor 100 according to the fourth embodiment of the present invention. FIG. 9B is a plan view showing a semiconductor region 103 in FIG. 9A. Note that matters not mentioned in the fourth embodiment can comply with the first embodiment. The fourth embodiment may be practiced in combination with the second and/or third embodiment.

In the first to third embodiments, the plurality of parts are electrically isolated from each other. However, this is not essential in the present invention. The effect of the present invention is obtained by shortening the distance between the finally-depleted portion in the second semiconductor region 103 and the side surface of the second semiconductor region 103. If the effect is implemented, the plurality of parts may be connected to each other. In the fourth embodiment, the semiconductor region 103 that constitutes a charge accumulation region includes a connecting portion 103D that connects a plurality of portions 103A and 103B to each other.

The solid-state image sensor 100 includes, as a floating diffusion, a third semiconductor region 121 of the second conductivity type formed in a first semiconductor region 102 of a semiconductor substrate SB. The solid-state image sensor 100 also includes, on the semiconductor substrate SB, a transfer gate 120 that forms, in the first semiconductor region 102, a channel to transfer charges from the second semiconductor region 103 to the third semiconductor region 121. The second semiconductor region 103 can be configured to arrange the connecting portion 103D between the transfer gate 120 and the plurality of portions 103A and 103B. This allows making the channel transfer charges from the second semiconductor region 103 to the third semiconductor region 121 wider and improve the charge transfer efficiency. Note that the connecting portion 103D may be arranged under the semiconductor region of the first conductivity type arranged between the plurality of portions 103A and 103B. That is, the potential barrier may be formed on the upper surface side of the semiconductor substrate SB, and the plurality of portions 103A and 103B may be connected at a deep portion of the semiconductor substrate SB.

Fifth Embodiment

Figure 10:
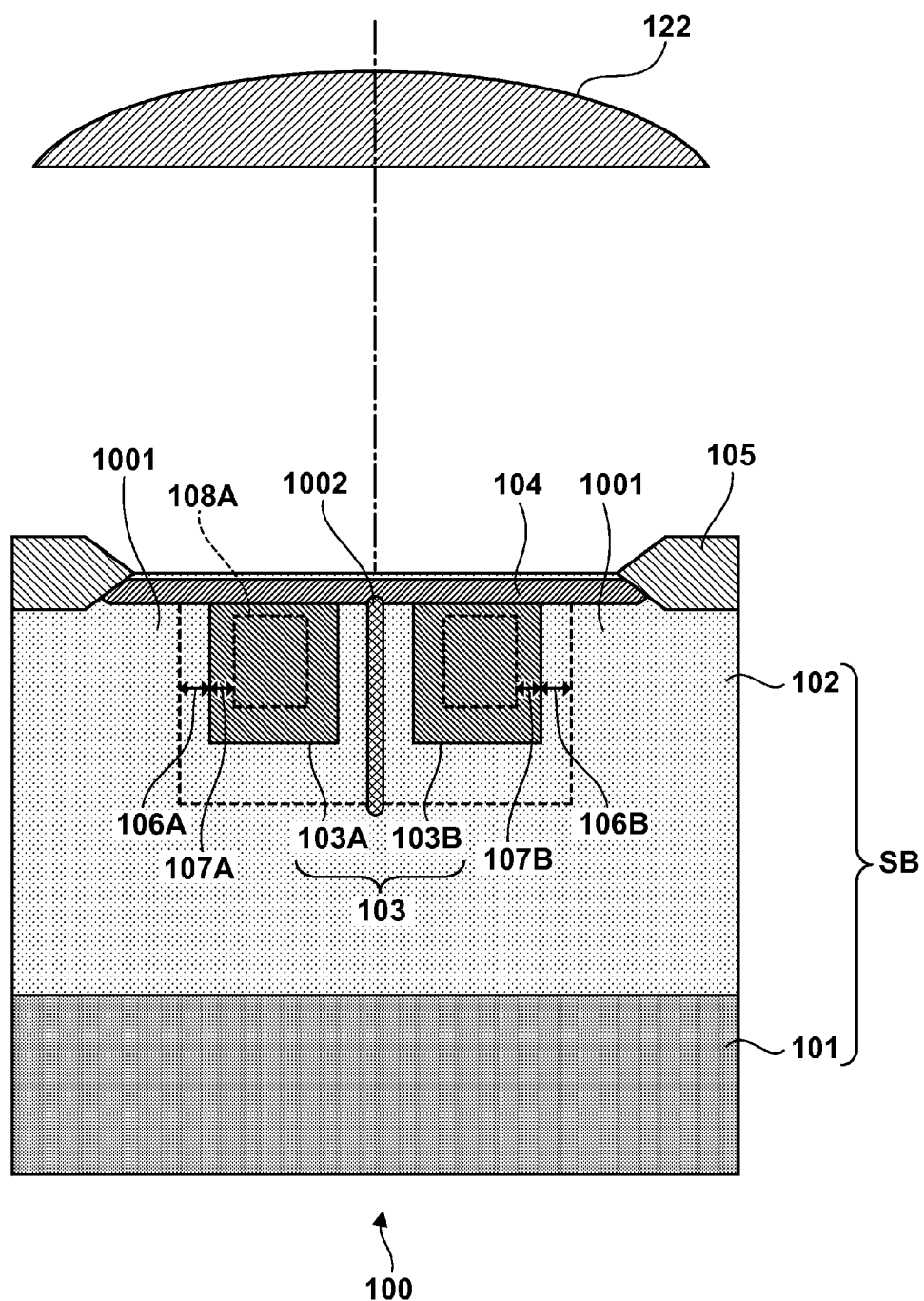
FIG. 10 is a sectional view schematically showing the structure of one pixel of a solid-state image sensor according to the fifth embodiment of the present invention.

The fifth embodiment of the present invention will be described below with reference to FIG. 10. FIG. 10 is a sectional view schematically showing the structure of one pixel of a solid-state image sensor 100 according to the fifth embodiment of the present invention. Note that matters not mentioned in the fifth embodiment can comply with the first embodiment. The fifth embodiment may be practiced in combination with at least one of the second to fourth embodiments.

A first semiconductor region 102 of the first conductivity type includes a first portion 1001 arranged to wholly surround a plurality of portions 103A and 103B that constitute a second semiconductor region 103, and a second portion 1002 arranged between the plurality of portions 103A and 103B. The impurity concentration in the second portion 1002 is higher than that in the first portion 1001, and the width of depletion regions 106A and 106B thus becomes small.

Sixth Embodiment

Figure 11:
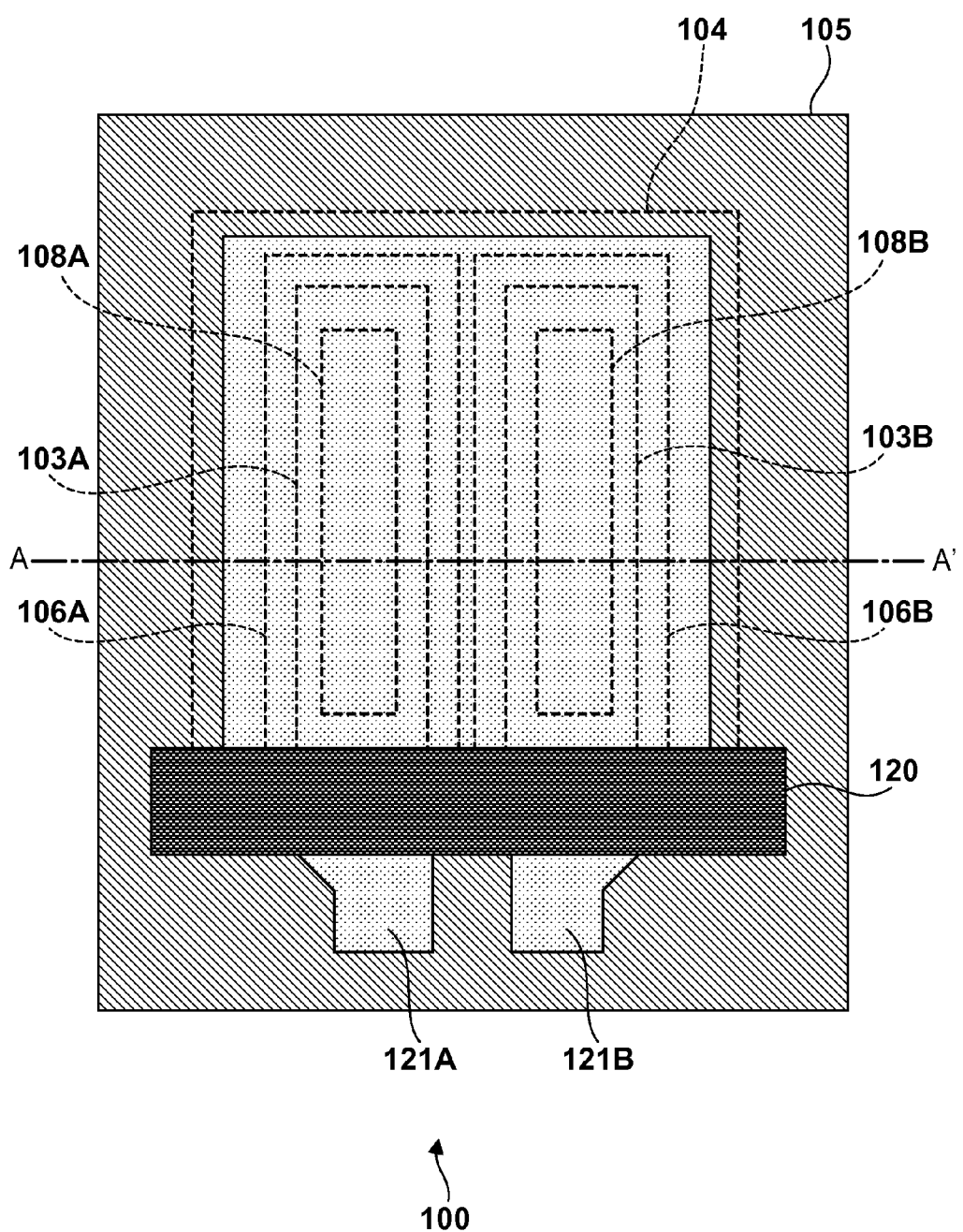
FIG. 11 is a plan view schematically showing the structure of one pixel of a solid-state image sensor according to the sixth embodiment of the present invention.

The sixth embodiment of the present invention will be described below with reference to FIG. 11. FIG. 11 is a plan view schematically showing the structure of one pixel of a solid-state image sensor 100 according to the sixth embodiment of the present invention. Note that matters not mentioned in the sixth embodiment can comply with the first embodiment. The sixth embodiment may be practiced in combination with at least one of the second to fifth embodiments.

In the sixth embodiment, a plurality of third semiconductor regions 121A and 121B of the second conductivity type (n type) are formed in a semiconductor substrate in correspondence with a plurality of portions 103A and 103B that constitute a charge accumulation region 103, respectively. The plurality of third semiconductor regions 121A and 121B constitute a floating diffusion (charge-voltage converter). A transfer gate 120 arranged on the semiconductor substrate forms, in a first semiconductor region 102, a channel to transfer charges from the portion 103A to the corresponding third semiconductor region 121A. The transfer gate 120 also forms, in the first semiconductor region 102, a channel to transfer charges from the portion 103B to the corresponding third semiconductor region 121B.

The solid-state image sensor 100 includes a readout circuit (not shown) used to individually read out signals corresponding to charges transferred to the plurality of third semiconductor regions 121A and 121B. Light enters the portions 103A and 103B via a common lens. Light that has passed through the first region of the pupil of an imaging lens and then passed through the common lens can enter the portion 103A. Light that has passed through the second region of the pupil of the imaging lens and then passed through the common lens can enter the portion 103B. This enables performance of focus detection by a phase-difference detection method based on the output of the solid-state image sensor 100. Note that the first region and the second region are different from each other.

Seventh Embodiment

Figure 12:
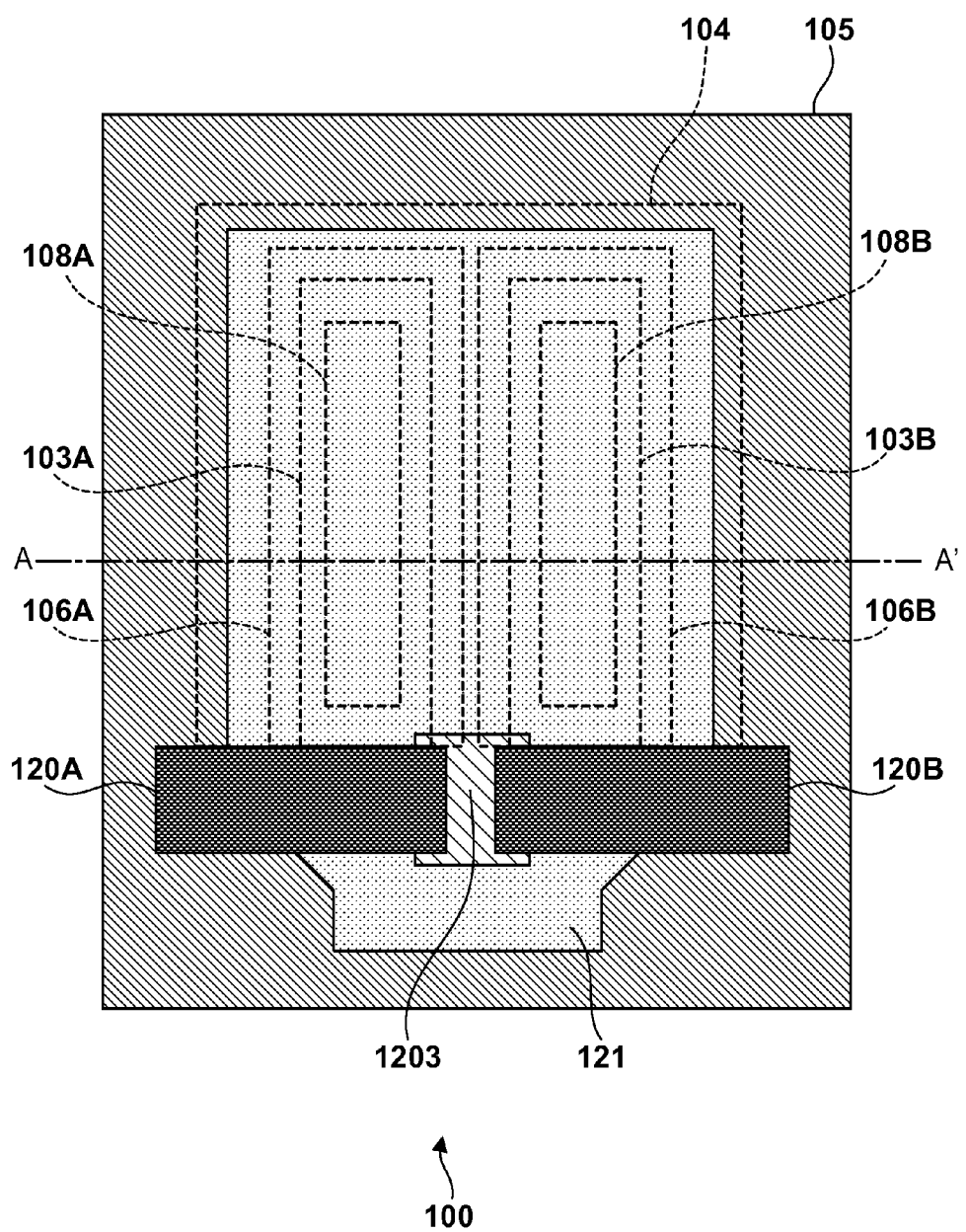
FIG. 12 is a plan view schematically showing the structure of one pixel of a solid-state image sensor according to the seventh embodiment of the present invention.

The seventh embodiment of the present invention will be described below with reference to FIG. 12. FIG. 12 is a plan view schematically showing the structure of one pixel of a solid-state image sensor 100 according to the seventh embodiment of the present invention. Note that matters not mentioned in the seventh embodiment can comply with the first embodiment. The seventh embodiment may be practiced in combination with at least one of the second to fifth embodiments.

In the seventh embodiment, a third semiconductor region 121 of the second conductivity type (n type), which is common to a plurality of portions 103A and 103B that constitute a charge accumulation region 103, is formed in a semiconductor substrate. The third semiconductor region 121 constitutes a floating diffusion (charge-voltage converter). In the seventh embodiment, a plurality of transfer gates 120A and 120B corresponding to the portions 103A and 103B that constitute the charge accumulation region 103, respectively, are arranged on the semiconductor substrate. The transfer gate 120A forms, in a first semiconductor region 102, a channel to transfer charges from the portion 103A to the common third semiconductor region 121. The transfer gate 120B forms, in the first semiconductor region 102, a channel to transfer charges from the portion 103B to the common third semiconductor region 121. The transfer gates 120A and 120B are electrically isolated from each other, and an element isolation 1203 is arranged under the portion between them.

The solid-state image sensor 100 includes a readout circuit (not shown) used to read out a signal corresponding to charges transferred to the common third semiconductor region 121. The readout circuit can read out a signal corresponding to the total amount of charges transferred from the portion 103A to the semiconductor region 121 by the transfer gate 120A and charges transferred from the portion 103B to the semiconductor region 121 by the transfer gate 120B.

The readout circuit can also individually read out a signal corresponding to charges transferred from the portion 103A to the semiconductor region 121 by the transfer gate 120A and a signal corresponding to charges transferred from the portion 103B to the semiconductor region 121 by the transfer gate 120B. For example, the readout circuit first reads out a signal corresponding to charges transferred from the portion 103A to the semiconductor region 121 by the transfer gate 120A and then a signal corresponding to charges transferred from the portion 103B to the semiconductor region 121 by the transfer gate 120B.

Light enters the portions 103A and 103B via a common lens. Light that has passed through the first region of the pupil of an imaging lens and then passed through the common lens can enter the portion 103A. Light that has passed through the second region of the pupil of the imaging lens and then passed through the common lens can enter the portion 103B. This enables performance of focus detection by a phase-difference detection method based on the output of the solid-state image sensor 100.

Application Example

As an application example of the solid-state image sensor according to each of the above-described embodiments, a camera incorporating the solid-state image sensor will exemplarily be explained. The concept of the camera includes not only an apparatus primarily aiming at photographing but also a device (for example, personal computer or mobile terminal) secondarily having a photographing function. The camera includes a solid-state image sensor according to the present invention exemplified in the embodiments, and a processing unit that processes a signal output from the solid-state image sensor. The processing unit can include, for example, an A/D converter and a processor that processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-008448, filed Jan. 18, 2012, which is hereby incorporated by reference herein in its entirety.

The invention claimed is:

1. A solid-state image sensor comprising:
a semiconductor substrate;
a first semiconductor region of a first conductivity type arranged in the semiconductor substrate;
a second semiconductor region of a second conductivity type constituting a charge accumulation region of a pixel, and being arranged in the first semiconductor region; and
a lens for condensing light to the second semiconductor region, wherein
the second semiconductor region includes a first portion and a second portion which are arranged in a first direction parallel to a surface of the semiconductor substrate,
a potential barrier to a charge accumulated in the charge accumulation region is formed between the first portion and the second portion,
an interval between the first portion and the second portion is within a range from 0.1 μm to 1.0 μm,
a size of the pixel along the first direction is within a range from 2.0 μm to 7.0 μm, and
a size of the first portion along a second direction parallel to a depth direction of the semiconductor substrate is larger than a size of the first portion along the first direction, and a size of the second portion along the second direction is larger than a size of the second portion along the first direction.

2. The sensor according to claim 1, wherein the first portion and the second portion are electrically isolated from each other.

3. The sensor according to claim 1, wherein
third and fourth semiconductor regions of the second conductivity type are arranged in the semiconductor substrate in correspondence with the first portion and the second portion, respectively, and
a transfer gate common to the first portion and the second portion is arranged on the semiconductor substrate to form a channel for transferring a charge from the first portion and the second portion to third semiconductor region and the fourth semiconductor region, respectively.

4. The sensor according to claim 1, wherein
a third semiconductor region of the second conductivity type common to the first portion and the second portion is arranged in the semiconductor substrate, and
a transfer gate common to the first portion and the second portion is arranged on the semiconductor substrate to form a channel for transferring a charge from the first portion and the second portion to the third semiconductor region.

5. The sensor according to claim 1, wherein
a third semiconductor region of the second conductivity type common to the first portion and the second portion is arranged in the semiconductor substrate, and
transfer gates are arranged on the semiconductor substrate to form channels for transferring charges from the first portion and the second portion to the third semiconductor region.

6. The sensor according to claim 1, wherein the second semiconductor region includes a connecting portion that connects the first portion and the second portion to each other.

7. The sensor according to claim 6, further comprising:
a third semiconductor region of the second conductivity type arranged in the semiconductor substrate; and
a transfer gate for forming a channel for transferring a charge from the second semiconductor region to the third semiconductor region, the transfer gate being arranged on the semiconductor substrate,
wherein the connecting portion is arranged between the transfer gate and a set of the first and second portions.

8. The sensor according to claim 1, wherein
the first semiconductor region includes a first part arranged to surround the first and second portions, and a second part arranged between the first portion and the second portion, and
an impurity concentration in the second part of the first semiconductor region is lower than an impurity concentration in the first part of the first semiconductor region.

9. The sensor according to claim 8, wherein
the second semiconductor region further includes a third portion,
the third portion is arranged between the first portion and the second portion which are arranged along the first direction, and a width of each of the first portion and the second portion in the first direction is larger than a width of the third portion in the first direction.

10. The sensor according to claim 1, wherein a semiconductor region of the second conductivity type that surrounds side surfaces of the first semiconductor region is arranged in the semiconductor substrate.

* * * * *